(12) United States Patent
Adham et al.

(10) Patent No.: US 12,400,725 B2
(45) Date of Patent: *Aug. 26, 2025

(54) CONDUCTING BUILT-IN SELF-TEST OF MEMORY MACRO

(71) Applicant: Taiwan Semiconductor Manufacturing Company, Ltd., Hsinchu (TW)

(72) Inventors: Saman Adham, Kanata (CA); Marat Gershoig, Ottawa (CA); Vineet Joshi, Hsinchu (TW); Ted Wong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 128 days.

This patent is subject to a terminal disclaimer.

(21) Appl. No.: 18/486,789

(22) Filed: Oct. 13, 2023

(65) Prior Publication Data
US 2024/0055066 A1    Feb. 15, 2024

Related U.S. Application Data

(63) Continuation of application No. 17/470,838, filed on Sep. 9, 2021, now Pat. No. 11,823,758.

(Continued)

(51) Int. Cl.
*G11C 29/36*    (2006.01)
*G11C 29/12*    (2006.01)
*G11C 29/44*    (2006.01)

(52) U.S. Cl.
CPC ........ *G11C 29/36* (2013.01); *G11C 29/12015* (2013.01); *G11C 29/4401* (2013.01); *G11C 2029/3602* (2013.01)

(58) Field of Classification Search
CPC .............. G11C 29/36; G11C 29/12015; G11C 29/4401; G11C 2029/3602
See application file for complete search history.

(56) References Cited

U.S. PATENT DOCUMENTS 5,991,909 A    11/1999    Rajski et al.
7,017,089 B1    3/2006    Huse
(Continued)

FOREIGN PATENT DOCUMENTS

CN    112070219 A    12/2020
TW    200823908 A    6/2008
TW    202029208 A    8/2020

OTHER PUBLICATIONS

Non-Final Office Action on U.S. Appl. No. 17/470,835 Dtd Oct. 5, 2023.

(Continued)

*Primary Examiner* — Mohammed A Bashar
(74) *Attorney, Agent, or Firm* — FOLEY & LARDNER LLP

(57) ABSTRACT

Performing a built-in self-test (BIST) on a memory macro includes generating a plurality of input vectors such that at least one input vector of the plurality of input vectors is transmitted to the memory macro in each of a plurality of cycles, receiving in each of the plurality of cycles, an output data from the memory macro. The output data is generated by the memory macro in response to processing the at least one input vector. The BIST also includes comparing the output data in each of the plurality of cycles with a signature value and determining whether the memory macro is normal or faulty based upon the comparison.

20 Claims, 9 Drawing Sheets

Related U.S. Application Data

(60) Provisional application No. 63/147,988, filed on Feb. 10, 2021.

(56) References Cited

U.S. PATENT DOCUMENTS

| | | | |
|---|---|---|---|
| 7,917,820 | B1 | 3/2011 | Pavle et al. |
| 10,636,481 | B1 | 4/2020 | Chang et al. |
| 11,428,737 | B1 | 8/2022 | Ziaja et al. |
| 11,605,422 | B2 | 3/2023 | Lu |
| 2004/0049529 | A1 | 3/2004 | Awaka et al. |
| 2008/0040640 | A1 | 2/2008 | Okabayashi |
| 2008/0126901 | A1 | 5/2008 | Cheng et al. |
| 2008/0244341 | A1 | 10/2008 | Yoshihara |
| 2010/0211836 | A1 | 8/2010 | Kodama |
| 2011/0007795 | A1 | 1/2011 | Yeh et al. |
| 2020/0387352 | A1 | 12/2020 | Chawla et al. |
| 2022/0254429 | A1 | 8/2022 | Wong et al. |
| 2023/0133360 | A1* | 5/2023 | Naous ............... G06F 15/7821 712/222 |
| 2023/0409452 | A1* | 12/2023 | Tonoyan ............... G06F 11/27 |

OTHER PUBLICATIONS

Non-Final Office Action on U.S. Appl. No. 17/470,838 Dtd Mar. 21, 2023.

Notice of Allowance on U.S. Appl. No. 17/470,838 Dtd Aug. 31, 2023.

VLSI Test Principles and Architectures13~Chapter 08 MBIST, Elsevier Publishing, Internet Archive—(Aug. 29, 2017) (Year: 2017).

Office Action issued in connection with Taiwan Appl. No. 111103104 dated Mar. 10, 2025.

* cited by examiner

CONDUCTING BUILT-IN SELF-TEST OF
MEMORY MACRO

CROSS-REFERENCE TO RELATED PATENT APPLICATIONS

This application is a continuation of U.S. patent application Ser. No. 17/470,838, filed Sep. 9, 2021, which is a non-provisional application of U.S. Provisional Application No. 63/147,988, filed Feb. 10, 2021, which are incorporated herein by reference in their entireties for all purposes.

BACKGROUND

The present disclosure relates generally to memory systems, and particularly to performing built-in self-tests in memory systems.

Deep learning algorithms evaluate data sets against predefined importance parameters or weights of several attributes. Such evaluation may be characterized by an additive weighting method that requires a large number of Multiply-and-Accumulate (MAC) operations. In some embodiments, discreet logic circuits may be used to implement the MAC operations. However, such logic circuits require high energy (e.g., power), large circuit implementation, and performance may be limited. Compute in Memory (CIM) is a promising energy efficient solution for deep learning applications. A CIM is configured to perform the MAC operations in addition to storing the data sets and the weights. A CIM is also easy to integrate into a memory system. However, challenges exist in performing Built-In Self-Test (BIST) in CIM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
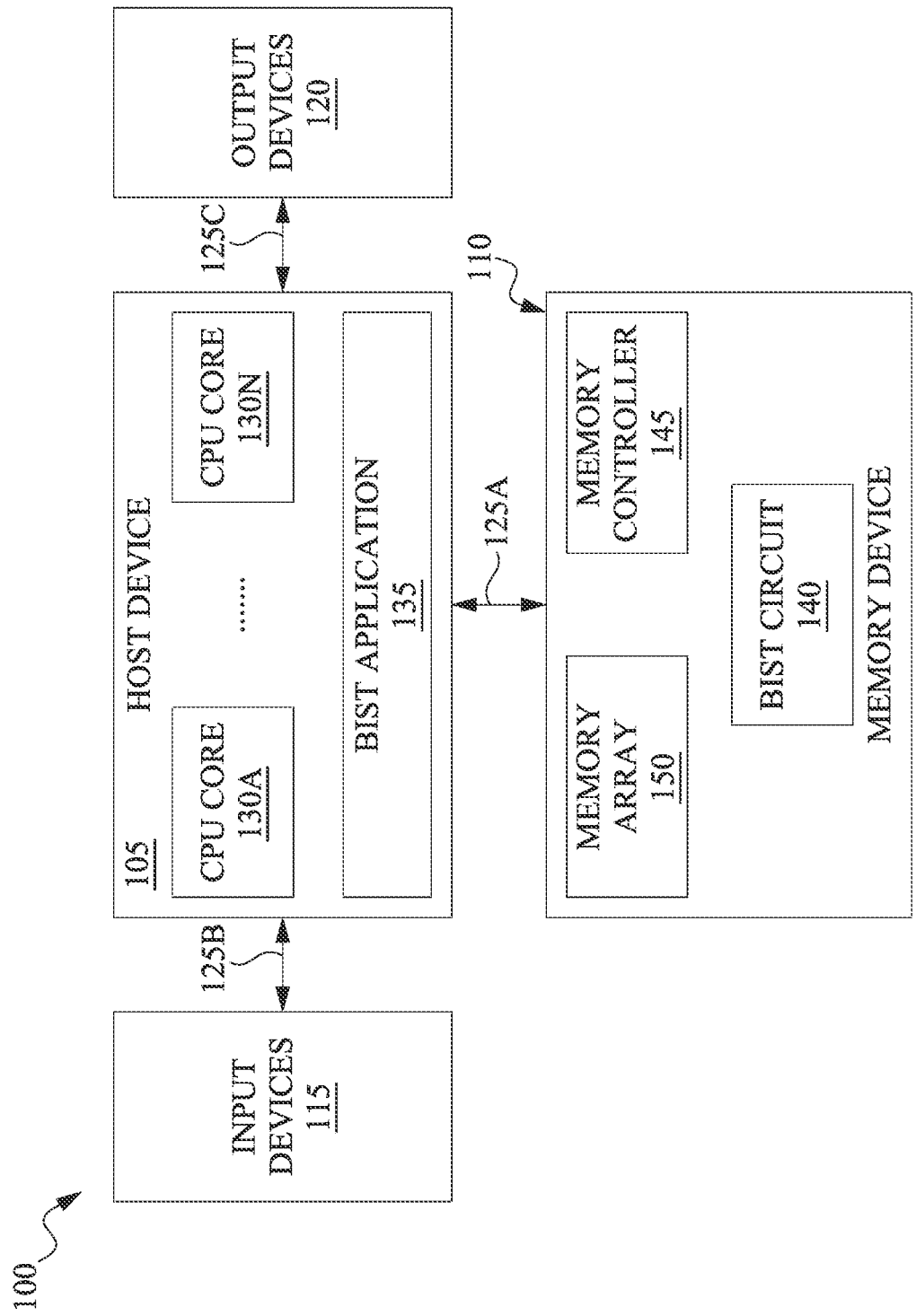
FIG. 1 is an example block diagram of a computing system configured to perform a Built-In Self-Test (BIST) in a Compute in Memory (CIM) macro, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used for implementing a Built In Self-Test (BIST) of a memory macro (e.g., a Compute In Memory (CIM) macro). The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing BIST using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user, to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, configuration data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing technology. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, perform BIST, and/or perform management or other operations.

One application that the host device 105 may be configured to run may be a BIST application 135. The BIST application 135 may be used in association with a BIST circuit 140 to test one or more memories of the memory device 110. Specifically, the BIST application 135 and the BIST circuit 140 may be used to identify faults or problems in the one or more memories of the memory device 110 that may cause those one or more memories to malfunction. The BIST application 135 and the BIST circuit 140 are discussed in greater detail below. In some embodiments, the instructions needed to execute or run the BIST application 135 and the BIST circuit 140 may be stored within the memory device 110. The BIST application 135 may be executed by one or more of the CPU cores 130A-130N using the instructions associated with the BIST application from the memory device 110. In some embodiments, the BIST application 135 may be used to enter configuration data into the BIST circuit 140, as well as generate various signals to perform BIST on the memory device 110.

Referring still to FIG. 1, the memory device 110 includes a memory controller 145 that is configured to read data from or write data to a memory array 150. In some embodiments, the memory array 150 may include a variety of volatile and/or non-volatile memories. For example, in some embodiments, the memory array 150 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for being tested using BIST. Generally speaking, the memory array 150 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for the functions described herein. In some embodiments, the memory array 150 may be configured as, or be part of, an embedded memory of a system on chip (SOC) integrated circuit device.

The memories within the memory array 150 may be individually and independently controlled by the memory controller 145. In other words, the memory controller 145 may be configured to communicate with each memory within the memory array 150 individually and independently. By communicating with the memory array 150, the memory controller 145 may be configured to read data from or write data to the memory array in response to instructions received from the host device 105. Although shown as being part of the memory device 110, in some embodiments, the memory controller 145 may be part of the host device 105 or part of another component of the computing system 100 and associated with the memory device. The memory controller 145 may be implemented as a logic circuit in either software, hardware, firmware, or combination thereof to perform the functions described herein.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 145 and the memory array 150 may each include other hardware, software, and/or firmware components that are considered necessary or desirable in performing the functions described herein.

Figure 2:
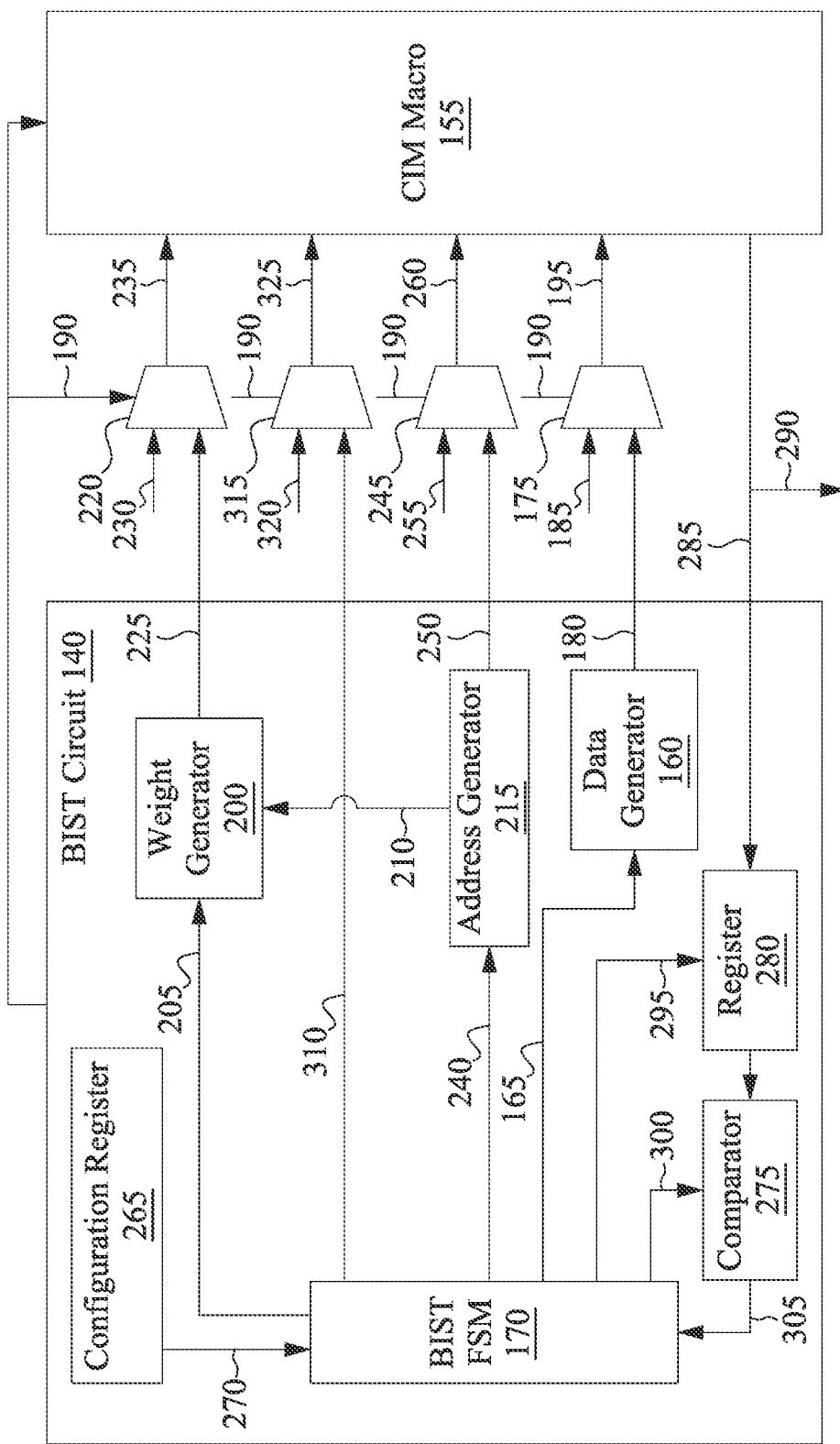
FIG. 2 is an example block diagram of a BIST circuit of the computing system of FIG. 1 for implementing a BIST on the CIM macro, in accordance with some embodiments of the present disclosure.

Turning to FIG. 2, an example block diagram of the BIST circuit 140 is shown, in accordance with some embodiments of the present disclosure. The BIST circuit 140 is shown connected to a CIM macro 155 for performing a BIST on the CIM macro. The CIM macro 155 may be part of the memory array 150. Although not shown, the CIM macro 155 may include a plurality of memory cells for storing data. In some embodiments, the CIM macro 155 may also include related peripheral circuitry (e.g., circuitry for reading data from the memory cell, writing data into the memory cells, etc.) The plurality of memory cells may be part of a memory address space of the CIM macro 155. The CIM macro 155 may also be configured to perform computations in addition to storing data. For example, in some embodiments, the CIM macro 155 may be configured to perform Multiply-and-Accumulate (MAC) operations on the data stored therein.

Thus, in some embodiments, the CIM macro 155 may be configured to perform two main functions: (a) a memory function for storing data used in the computations of the MAC operations; and (b) a compute function for performing the MAC operations on the stored data. In some embodiments, the CIM macro 155 may implement the MAC operation of the compute function as follows:

$$Q\_CIM[j] = \sum_{i=0}^{M} X[i] \cdot W[i, j]$$

In the formula above, M is a total number of attributes (e.g., number of rows in the memory address space of the CIM macro 155), Q_CIM[j] is the accumulated result for the $j^{th}$ cycle, X[i] is the input data, and W[i, j] is the weight being applied to the input data in the $j^{th}$ cycle. In some embodiments, the CIM macro 155 may implement the MAC operations using analog circuits including a transistor level implementation. The analog circuits may be embedded inside the CIM macro 155. In other embodiments, the CIM macro 155 may implement the MAC operations using digital circuits. In some embodiments, the digital circuits may include discreet logic circuits that are outside, and associated with, the CIM macro 155 for performing the MAC operations. In other embodiments, the digital circuits may include logic circuits that are embedded into the CIM macro 155. In yet other embodiments, the CIM macro 155 may implement the MAC operations using a combination of analog and digital circuits.

Further, in some embodiments, the analog circuit implementation of the MAC operation may be tested using analog functional test methods. In other embodiments, the analog circuit implementation may be tested using the BIST circuit 140. The discreet logic circuit implementation that is outside, and associated with, the CIM macro 155 may be tested separately from the CIM macro. However, inventors have found no testing methods for CIM macros (e.g., the CIM macro 155) that have the logic circuits for the MAC implementation embedded therein. The BIST circuit 140 may be used to perform BIST on the CIM macro 155 that have the MAC operation functionality embedded therein. A BIST may be used by the CIM macro 155 to test itself with high reliability and accuracy. To perform the BIST on the CIM macro 155, the BIST circuit 140 may be part of the memory device (e.g., the memory device 110) associated with the CIM macro. Thus, in some embodiments, the BIST circuit 140 and the CIM macro 155 may be configured as an SOC.

Although the present disclosure is described in terms of testing the CIM macro 155, it is to be understood that the present disclosure may be used to perform BIST using the BIST circuit 140 on any suitable memory macro or memory device.

The BIST circuit 140 may be configured to generate data for performing BIST on the CIM macro 155. The data may include input data and weight data. The BIST circuit 140 may also be configured to receive output data from the CIM macro 155. The output data may be the result of the MAC operations on the input data and the weight data using the equation discussed above. The BIST circuit 140 may additionally be configured to compare the output data with expected data (e.g., a signature value) to determine if the CIM macro 155 is normal or faulty. The CIM macro 155 may be considered "normal" if the CIM macro performs the MAC operations accurately. The CIM macro 155 may be considered "faulty" if the CIM macro produces inaccurate MAC operation results.

To generate the input data, the BIST circuit 140 may include a data generator 160. The data generator 160 may be configured to generate deterministic, random, or pseudo random input vectors for testing the CIM macro 155. A deterministic input data may include an input vector having a known or specific value. A random or pseudorandom input data may include a randomly or pseudo-randomly generated input vector. Each input vector may be of a designated bit width. In some embodiments, the bit width of the input vector may be dependent upon the configuration of the CIM macro 155. For example, in some embodiments, the data generator 160 may be configured to generate input vectors of 64 bits if the CIM macro 155 is configured to handle data of 64 bits. In other embodiments, each input vector may be 32 bits, 72 bits, 128 bits, or of any other bit width depending upon the configuration of the CIM macro 155.

In some embodiments, the data generator 160 may be configured to generate the input vectors using a linear feedback shift register, a series of automated circuits, or any other suitable mechanism. Although not shown, the data generator 160 may be configured as hardware, software, firmware, or a combination thereof. In some embodiments, the data generator 160 may generate the input vectors based upon an input 165 received from a BIST Finite State Machine (FSM) 170. In some embodiments, the BIST FSM 170 may generate the input 165 based upon a configuration value. In some embodiments, the configuration value may include the input vector value that is to be generated by the data generator 160. In some embodiments, the configuration value may indicate an initial input vector value for the data generator 160 to generate an input vector. The configuration value may also include an increment value or shift value to indicate to the data generator 160 how to generate additional input vectors from the initial input vector value. For example, in some embodiments, the configuration value may indicate an increment value of 1. The data generator 160 may then increment the initial input vector value by 1 to obtain a first input vector value, increment the first input vector value by 1 to obtain a second input vector value, and so on. Thus, the data generator 160 may be configured to generate the input vectors in any suitable way.)

The data generator 160 may transmit the generated input vector into a multiplexer 175 as input 180. The multiplexer 175 may also receive an input 185. The input 185 may be a functional input vector used during normal operation (e.g., when BIST is not being performed) of the CIM macro 155. Based upon an enable signal 190, the multiplexer 175 may select either the input 180 or the input 185 as output 195. The output 195 may be input into the CIM macro 155 for a MAC operation. In some embodiments, the output 195 may be stored (e.g., into an input register) into the CIM macro 155. The enable signal 190 may be generated by the BIST circuit 140 (e.g., by the BIST FSM 170). If the enable signal 190 indicates a BIST mode, the multiplexer 175 selects the input 180 as the output 195 and if the enable signal indicates a functional mode (e.g., normal operation), the multiplexer selects the input 185 as the output. Although the multiplexer 175 is shown separate from the CIM macro 155, in some embodiments, the multiplexer may be part of the CIM macro. For example, in some embodiments, the multiplexer 175 may be part of the peripheral circuitry of the CIM macro 155. In other embodiments, the multiplexer 175 may be part of the BIST circuit 140 or any other component associated with the BIST circuit and the CIM macro 155.

The BIST circuit 140 may also include a weight generator 200. Although not shown, the weight generator 200 may be configured as hardware, software, firmware, or a combination thereof. The weight generator 200 may generate one or more weights to be applied to the input vector generated by the data generator 160. In some embodiments, the weight generator 200 may generate the weights based upon an input 205 received from the BIST FSM 170. The weight generator 200 may also receive an input 210 from an address generator 215 to identify the memory addresses of the CIM macro 155 for which the weights are to be generated. Weight generation is discussed in greater detail below. The weights generated by the weight generator 200 are input into a multiplexer 220 as input 225.

The multiplexer 220 may also receive a functional weight input 230 (e.g., used during normal operation of the CIM macro 155). Based upon the enable signal 190, the multiplexer 220 may select either the input 225 or the functional weight input 230 as output 235, which is input into the CIM macro 155. The output 235 may be stored within a memory address space of the CIM macro 155. If the enable signal 190 indicates a BIST mode, the multiplexer 220 selects the input 225 as the output 235 and if the enable signal indicates a functional mode (e.g., normal operation), the multiplexer selects the functional weight input 230 as the output. Similar to the multiplexer 175, the multiplexer 220 may be part of the CIM macro 155, the BIST circuit 140, or any other component associated with the BIST circuit or the CIM macro.

The address generator 215 may be configured to generate memory addresses where the weights generated by the weight generator 200 are to be stored in the CIM macro 155. The address generator 215 may generate the memory addresses in response to an input 240 received from the BIST FSM 170. The input 240 may indicate the memory addresses or address range of the CIM macro 155 based on which the address generator 215 generates the addresses. In some embodiments, the address generator 215 may be configured to generate write addresses for storing the input vectors, write addresses for storing the weights, read addresses for reading the stored input vectors and weights for performing the MAC operations, and/or write addresses for storing the output data before transmission back to the BIST circuit 140. In some embodiments, the address generator 215 may be configured as a linear feedback shift register or use other types of logic circuits or mechanisms to generate the addresses. The address generator 215 may input the generated memory addresses into a multiplexer 245 as input 250. The multiplexer 245 may also receive a functional memory address input 255 (e.g., used during normal operation of the CIM macro 155). Based upon the enable signal 190, the multiplexer 245 may select either the input 250 or the input 255 as output 260, which is input into the CIM macro 155. If the enable signal 190 indicates a BIST mode, the multiplexer 245 selects the input 250 as the output 260 and if the enable signal indicates a functional mode (e.g., normal operation), the multiplexer selects the input 255 as the output. In some embodiments, the multiplexer 245 may be part of the CIM macro 155, the BIST circuit 140, or any other component associated with the BIST circuit and/or the CIM macro.

The BIST circuit 140 may also include a configuration register 265. The configuration register 265 may be used to receive configuration values from a user to configure or initialize the BIST. For example, in some embodiments, the configuration register 265 may receive an input from a user (e.g., via the BIST application 135) indicating which BIST methodology to apply. For example, in some embodiments, the BIST methodology may be a broadside input pattern BIST methodology, a multiple background weights BIST methodology, a weight as memory background BIST methodology, or a lossless compression BIST methodology. Each of these BIST methodologies is explained in greater detail below. The BIST methodology may be indicative of the input data to be used, the weights to be used, the address range to be used, the number of cycles in the BIST, the signature value in each cycle, and any other details that may be needed or desired in performing the BIST for that BIST methodology. The configuration values may be input from the configuration register 265 into the BIST FSM 170, as indicated by arrow 270. Based upon the configuration values, the BIST FSM 170 may generate one or more inputs (e.g., the input 165, 205, 240, etc.) for controlling the operation of the other components (e.g., data generator 160, the weight generator 200, the address generator 215, etc.) of the BIST circuit 140.

The BIST FSM 170 may also control the operation of a comparator 275 and a register 280. Upon receiving the various BIST inputs (e.g., the input vector and the weights), the CIM macro 155 may perform the compute function using the equation discussed above. The result of that computation may be output from the CIM macro 155 as output 285. The output 285 may be input into the register 280, as well as output for user review, as indicated by arrow 290. The output 285 may be stored within the register 280 based upon a control signal 295 received from the BIST FSM 170. The output 285 may also be input from the register 280 into the comparator 275. The comparator 275 may compare the output 285 with a signature value received from the BIST FSM 170 via a signature signal 300.

The signature value may indicate the expected value of the computation performed by the CIM macro 155 for the input vector and weights input into the CIM macro in the BIST mode. An output 305 of the comparator 275 may indicate whether the output 285 matches the signature value. In some embodiments, the output 305 may be input into the BIST FSM 170, which in some embodiments, may send that output to the configuration register 265. The user may read the output 305 from the configuration register 265 to determine if the CIM macro 155 is normal or faulty. In some embodiments, the BIST FSM 170 may also store the output 305 into the register 280 or another register.

In some embodiments, the BIST may be performed over a plurality of cycles. Each of the plurality of cycles may include applying an input vector and weights into the CIM macro 155 from the BIST circuit 140, the CIM macro performing the MAC operations on the input vector and the weights and sending the output 285 back to the BIST circuit 140. In some embodiments, the output 305 of the comparison of the output 285 with the signature value may be stored in the register 280, and the determination of whether the CIM macro 155 is faulty or normal may be made at the end of the plurality of cycles based upon an analysis of the output 305 of each of the plurality of cycles. In some embodiments, the number of the plurality of cycles that are used may be a large number to provide greater fault coverage and fault diagnosis of the CIM macro 155. For example, in some embodiments, the number of the plurality of cycles may be greater than the number of cycles during an actual functioning of the CIM macro 155. Further, in some embodiments, the same BIST methodology may be implemented in each of the plurality of cycles. In other embodiments, a combination of methodologies may be used in the plurality of cycles.

The BIST FSM 170, as indicated above, may be configured to control the operation of the BIST circuit 140. Based upon the configuration values received from the configuration register 265, the BIST FSM 170 may generate the input 165 to the data generator 160 to generate one or more input vectors. Similarly, based upon the configuration values, the BIST FSM 170 may generate the input 205 to the weight generator 200 to generate the weights, as well as the input 240 to the address generator 215 to generate the addresses. The BIST FSM 170 may also generate a control signal 310 that may serve as a write enable signal to allow the data being sent by the BIST circuit 140 to be written into the CIM macro 155. Specifically, the control signal 310 may be input into a multiplexer 315.

The multiplexer 315 may also receive an input 320. Based upon the enable signal 190, the multiplexer 315 may select either the control signal 310 or the input 320 as output 325, which is input into the CIM macro 155. The input 320 may be a control signal (e.g., write enable) used for storing data within the CIM macro 155 during normal operation. Thus, the input 320 may be considered a functional control signal. If the enable signal 190 indicates a BIST mode, the multiplexer 315 selects the control signal 310 as the output 325 and writes the data (e.g., input vector and weights) being sent by the BIST circuit 140 to the CIM macro 155. If the enable signal 190 indicates a functional mode (e.g., normal operation), the multiplexer 315 selects the input 320 as the output 325 and writes the functional data (e.g., the functional input vector and functional weights) into the CIM macro 155. In some embodiments, the multiplexer 315 may be part of the CIM macro 155, the BIST circuit 140, or any other component associated with the BIST circuit and/or the CIM macro.

It is to be understood that only some components of the BIST circuit 140 are shown and described herein. Nevertheless, the BIST circuit 140 may include other or additional components that may be needed or considered desirable to have in performing the functions described herein. Further, the data generator 160, the BIST FSM 170, the weight generator 200, the address generator 215, the configuration register 265, the comparator 275, and the register 280 may be configured as software, hardware, firmware, or combination thereof, and may be sized as needed. Similarly, the multiplexers 175, 245, 315, and 220 may be configured in any suitable way.

Figure 3:
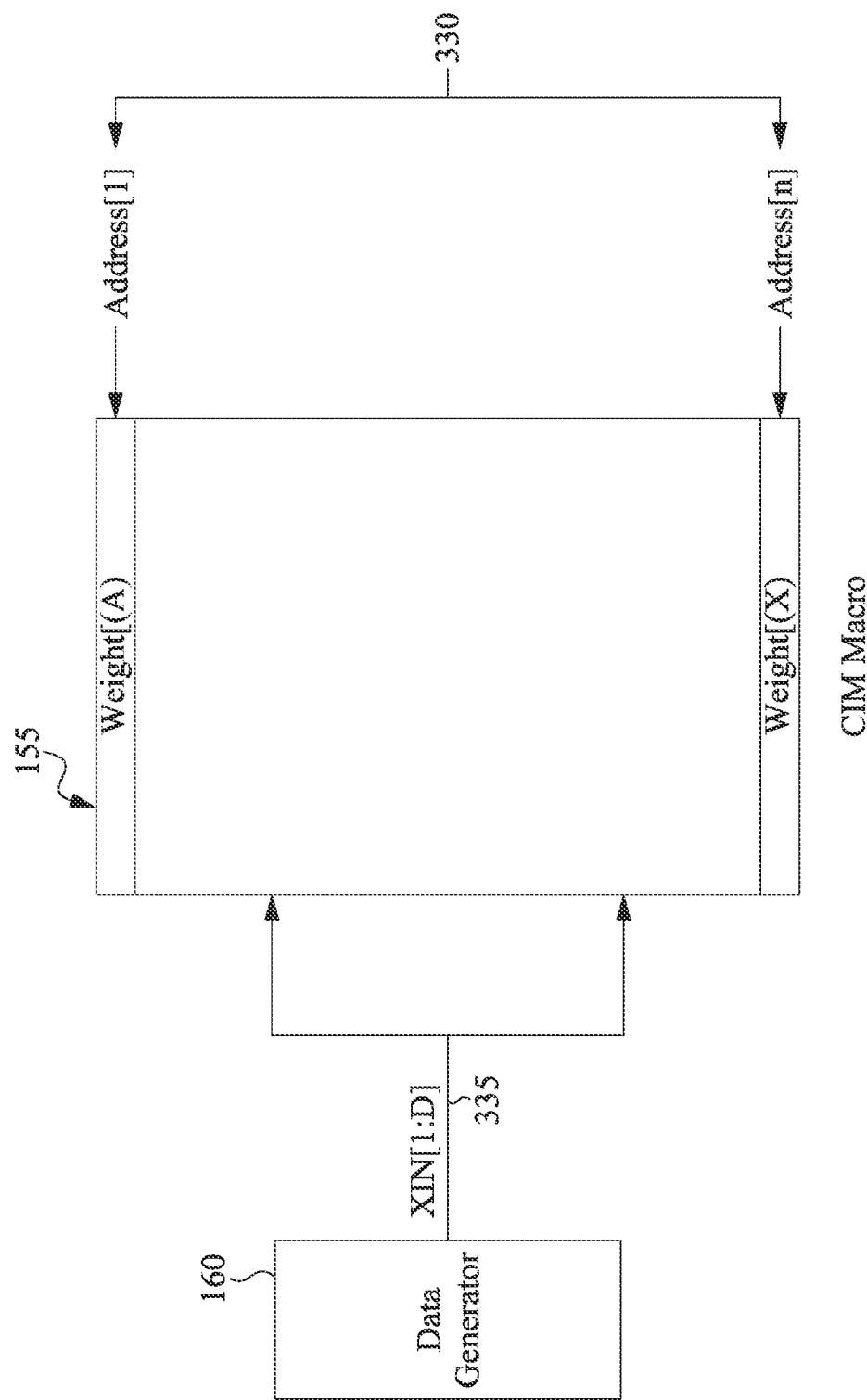
FIG. 3 is an example block diagram showing additional details of the BIST implementation by the BIST circuit of FIG. 2, in accordance with some embodiments of the present disclosure.

Turning now to FIG. 3, an example block diagram showing additional details of BIST are shown, in accordance with some embodiments of the present disclosure. Specifically, FIG. 3 shows the CIM macro 155 and the data generator 160 of the BIST circuit 140. The CIM macro 155 has a memory address space 330 having a plurality of memory addresses (e.g., memory address [1:n]). Each memory address in the memory address space 330 may be considered a row and may be configured to store one or more weight values. In some embodiments, each memory address of the memory address space 330 may be configured to store a different weight value. In some embodiments, at least some of the memory addresses in the memory address space 330 may be configured to store a same weight value. The weight values stored in the memory address space 330 may be unsigned values or signed values (e.g., 2's complements of the unsigned values). Generation of the weight values is discussed below.

Further, in some embodiments, the input vectors that are applied to the weight values stored in the memory address space 330 may be of a designated bit width, D. The input vector of bit width, D, may be applied to the weight(s) stored in each row of the memory address space 330 using the equation discussed above to perform the MAC operations. In some embodiments, for an input vector of a bit width, D, the data generator 160 may generate an input vector of size D (e.g., XIN[1:D]). The XIN[1:D] bits of the input vector may be applied to the weight values stored in each row of the memory address space 330, as shown by arrow 335. Thus, in some embodiments, for each row of the memory address space 330, the CIM macro 155 may compute a product between the input vector and the weights stored in that row to obtain a partial product. The partial product from each row of the memory address space 330 may then be added to generate the output 285 for a cycle.

Figure 4:
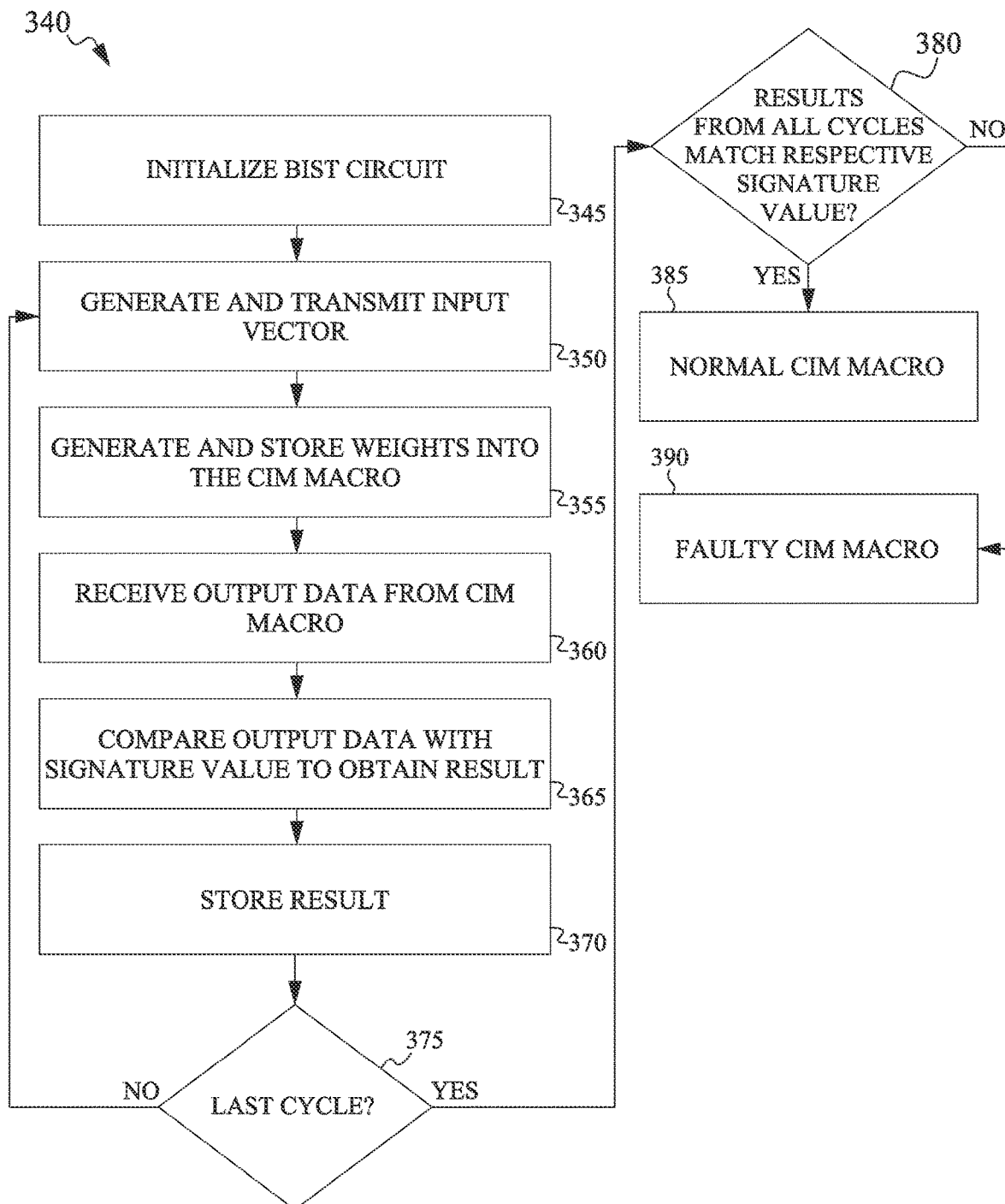
FIG. 4 is an example flowchart outlining operations of a process performed by the BIST circuit of FIG. 2 for implementing a broadside input pattern BIST methodology on the CIM macro, in accordance with some embodiments of the present disclosure.

Turning now to FIG. 4, an example flowchart outlining operations of a process 340 for implementing a broadside input pattern BIST methodology is shown, in accordance with some embodiments of the present disclosure. The process 340 may be implemented by the BIST circuit 140. To implement the broadside input pattern BIST methodology, at operation 345, the BIST circuit 140 is initialized or configured. Specifically, at the operation 345, a user may input configuration values into the configuration register 265. The configuration values may include the data pattern to be generated for each cycle, a number of cycles, an expected signature value for each cycle, an initial weight register value, memory addresses, and any other input that may be needed or considered desirable to have in implementing the process 340. In each cycle, the data generator 160 may generate at least one input vector. Thus, in some embodiments, each cycle of the plurality of cycles may be based on a different input vector.

The configuration values input into the configuration register 265 may be transmitted to the BIST FSM 170, which may then generate the inputs 165, 240, 205, 310, 295, and 300, as discussed above. Upon receiving the input 165, the data generator 160 generates an input vector at operation 350 for a current cycle of a plurality of cycles. The input 165 may indicate the data pattern based on which the data generator 160 is to generate the input vector. In some embodiments, to transmit (and possibly store) the input vector into the CIM macro 155 (e.g., into an input register), the BIST FSM 170 may generate the enable signal 190 that allows the multiplexer 175 to select the input 180 from the data generator 160 of the BIST circuit 140. The BIST FSM 170 may also generate the control signal 310 that allows the multiplexer 315 to select the control signal from the BIST circuit and facilitate the transmission and/or writing of the input vector into the CIM macro 155.

At operation 355, weights are generated and stored within the memory address space 330 of the CIM macro 155. Although the generation of the input vector is described as occurring before the generation of the weights, in some embodiments, the generation of the weights may occur before the generation of the input vector, or both operations may occur in parallel. In some embodiments, the same weight values may be used in each of the plurality of cycles. In other embodiments, different weight values may be used in at least some of the plurality of cycles. In some embodiments, the weight values may be stored in the CIM macro 155 at the addresses provided by the address generator 215. To write the weight values into the CIM macro 155, the enable signal 190 allows the multiplexer 220 to select the weight values from the BIST circuit 140 as the output 235, which may be written to the addresses selected by the address generator 215.

Upon sending the input vector and the weight values into the CIM macro 155, at operation 360, the BIST circuit 140 receives the output data from the CIM macro. Specifically, the CIM macro performs a MAC operation on the input vector of the operation 350 and the weight values of the operation 355. More specifically, the weight value stored at each memory address of the memory address space 330 is multiplied by the input vector to obtain a partial product for each memory address. The various partial products are then summed to obtain the output data. Thus, each cycle in the plurality of cycles may generate one output data. The output data (e.g., the output 285) may be received and stored into the register 280 and also provided to the comparator 275.

At operation 365, the comparator 275 compares the output data from the operation 360 with the signature value received as a configuration value at the operation 345. The comparison may indicate whether the output data from the operation 360 matches the signature value or does not match the signature value. In some embodiments, the result (e.g., match or no match) of the comparison is sent to the BIST FSM 170 at operation 370, which may send the result to the register 280 for storing. At operation 375, the BIST FSM 170 determines if additional cycles are remaining in the BIST. If more cycles are remaining, the process 340 loops back to the operation 345 where a new input vector is generated and transmitted to the CIM macro. In some embodiments, new weights may also be generated at the operation 355. In other embodiments, the same weights may be used. The operations 345-370 may be repeated for each cycle.

Upon completing all the plurality of cycles, at operation 380, the BIST FSM 170 analyzes all the stored results from the operation 370. If the results in all of the cycles indicate a match with their respective signature values, the process 340 proceeds to operation 385 where the BIST FSM 170 declares the CIM macro 155 to be normal. On the other hand, if at least one of the results do not match their respective signature value, the process 340 proceeds to operation 390 where the BIST FSM 170 declares the CIM macro 155 to be faulty. Thus, in some embodiments, the CIM macro 155 is considered normal only upon the output data from each of the plurality of cycles matching the signature value of that cycle. In some embodiments, instead of passing the CIM macro 155 only upon the output data from each cycle of the plurality of cycles matching their respective signature values, in some embodiments, the CIM macro may be considered normal if the number of cycles in which there is a match is above a predefined threshold. For example, in some embodiments, the BIST FSM 170 may consider the CIM macro 155 to be normal of if X % of the cycles have output data that match their respective signature values. Thus, the benchmark for finding the CIM macro 155 to be normal or faulty may be predefined and provided as a configuration value and stored within the BIST FSM 170. In some embodiments, the determination of whether the CIM macro 155 is normal or faulty may be written into the configuration register 265 from which a user may read and determine the status of the CIM macro.

Figure 5:
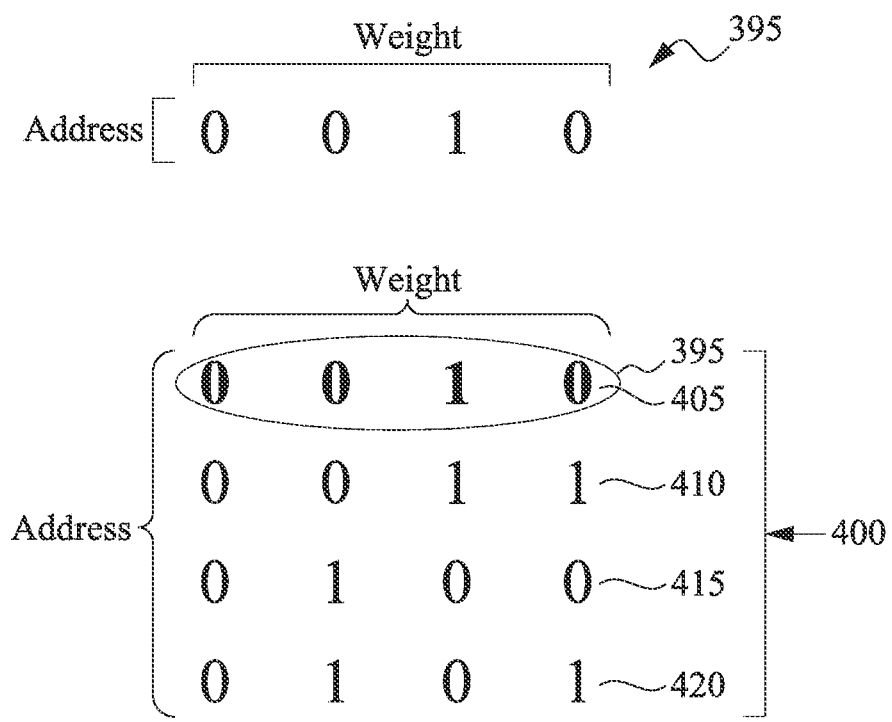
FIG. 5 is an example block diagram showing an initial weight register and an active weight register used by the BIST circuit of FIG. 2 for generating weights for implementing the BIST on the CIM macro, in accordance with some embodiments of the present disclosure.

Referring now to FIG. 5, an example diagram explaining weight value generation is shown, in accordance with some embodiments of the present disclosure. The weight values are generated by the weight generator 200 described with reference to FIG. 2. The weight generator 200 may generate the weight values based on an initial weight register value, an increment value, and the write address. In some embodiments, the initial weight register value, the increment value, and the write addresses may be provided as a configuration value within the configuration register 265. From the configuration register 265 described with reference to FIG. 2, these configuration values may be transmitted to the BIST FSM 170, which may then generate the inputs 205 and 240. Based on the input 240, the address generator 215 may generate the write addresses and send the write addresses to the weight generator 200 as the input 210. The weight generator 200, upon receiving the input 205 and the input 210 from the address generator 215 may generate weight values for each memory address in the memory address space 330 of the CIM macro 155.

In some embodiments, the weight generator 200 may use two registers to generate the weight values: an initial weight register 395 and an active weight register 400. In some embodiments, the weight generator 200 may receive the initial weight register value via the input 205. The weight generator 200 may write the initial weight register value in the initial weight register 395 and designate that value for an initial write address as determined by the input 210. For example, and as shown in FIG. 5, the initial weight register 395 has been initialized with the value 0010. It is to be understood that the values in FIG. 5 are only an example and not intended to be limiting in any way.

Based on the value in the initial weight register 395, the weight generator 200 may populate the active weight register 400 as follows:

$$awr_0 \leftarrow iwr$$

$$awr_{i+1} \leftarrow F(awr_i + C, A)$$

In the function above, awn indicates a row of the active weight register 400, C indicates the increment value, and A indicates the write address where the $awr_{i+1}$ value is to be written.

Thus, the active weight register 400 may be initialized with the value of the initial weight register 395 to be written in the memory address indicated in the initial write address. For example, a first row 405 of the active weight register 400 is shown as being initialized with the initial weight register value to be written in the initial write address. Based on the value in the first row 405, the weight value for a second row 410 of the active weight register 400 is determined. For example, if the increment value is 1, the weight value in the first row 405 is incremented by 1 to obtain the value of 0011 shown in the second row 410 and designated to be written in the next memory address. Similarly, the weight value in a third row 415 of the active weight register 400 may be determined by incrementing the weight value in the second row 410 by 1, and the weight value in a fourth row 420 of the active weight register may be determined by incrementing the weight value in the third row by 1.

Although the active weight register 400 is shown as having only four rows, with each row corresponding to a particular memory address, the number of rows in the active weight register may be dependent upon the number of memory addresses in the memory address space 330 for which the weight values are being generated (e.g., number of memory addresses in the memory address space 330). For example, if the memory address space 330 has 64 memory addresses, the active weight register 400 may include 64 rows—one row for each memory address. Further, although the increment value used in the example above is 1, other increment values may be used in other embodiments.

The weight values in the active weight register 400 may be written into the CIM macro 155. For example, the weight value in the first row 405 of the active weight register 400 may be written into a first memory address of the memory address space 330 of the CIM macro 155. Similarly, the weight value in the second row 410 may be written into a second memory address, and so on. Thus, in some embodiments, the active weight register may generate unique weight values for each memory address of the memory address space 330.

Figure 6:
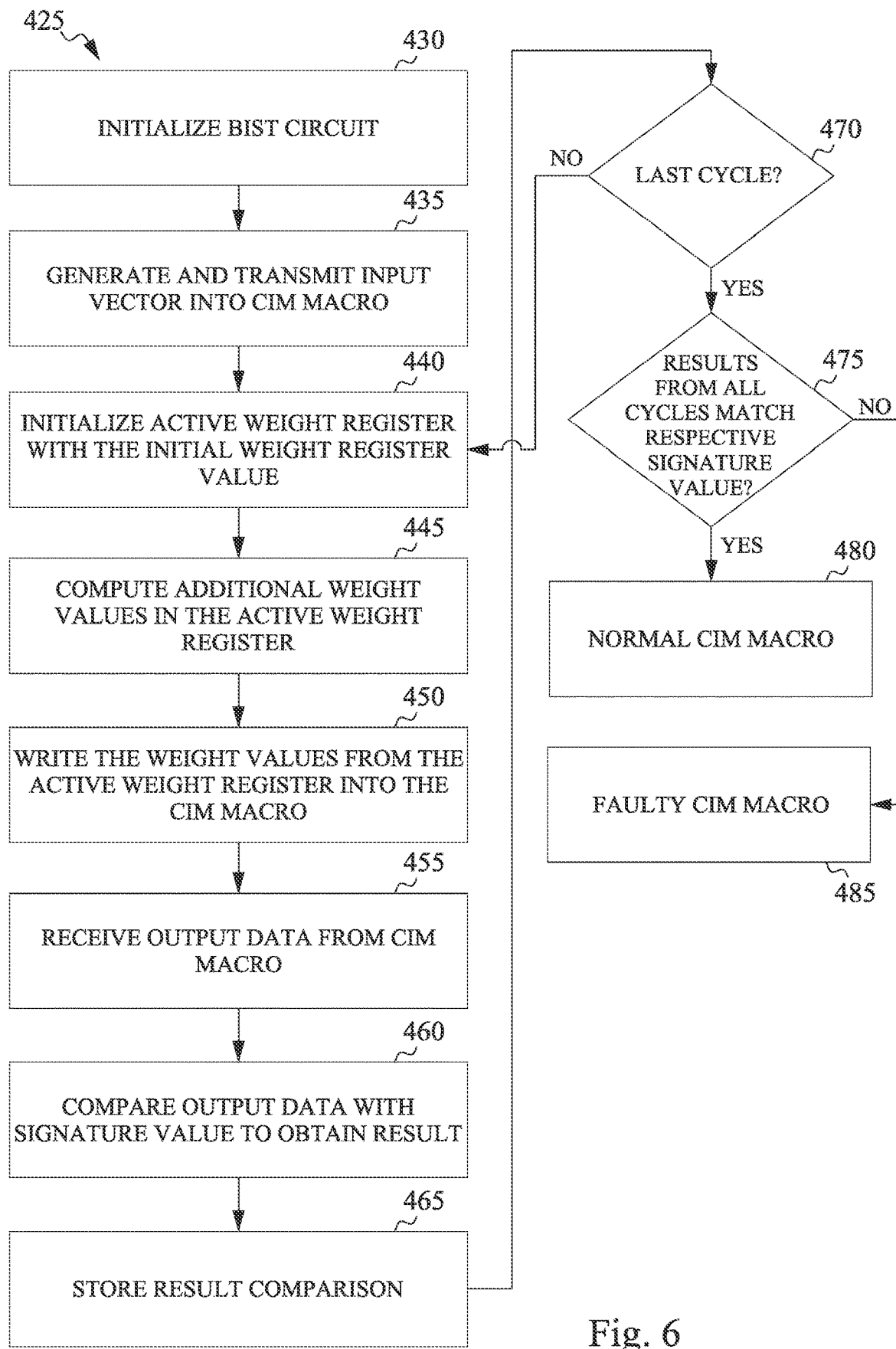
FIG. 6 is an example flowchart outlining operations of a process performed by the BIST circuit of FIG. 2 for implementing a weight as memory background BIST methodology on the CIM macro, in accordance with some embodiments of the present disclosure.

Turning to FIG. 6, an example flowchart outlining operations of a process 425 is shown, in accordance with some embodiments of the present disclosure. The process 425 may be used to implement a weight as memory background BIST methodology for performing BIST on the CIM macro 155. At operation 430, the BIST circuit 140 is initialized by writing configuration values in the configuration register 265

(see FIG. 2). The configuration values may include the data pattern to be generated for each cycle, a number of cycles, an expected signature value for each cycle, an initial weight register value for each cycle, memory addresses, and any other input that may be needed or considered desirable to have in implementing the process 425. At operation 435, the data generator 160 generates an input vector and stores that input vector (e.g., in an input register) in the CIM macro 155, as discussed above with respect to FIGS. 3 and 4. In some embodiments, the same input vector may be used for each cycle and the weight values may be varied in each cycle. In other embodiments, both the input vector and the weight values may be varied in at least some cycles.

At operation 440, the weight generator 200 initializes the active weight register 400 with the value of the initial weight register 395. In some embodiments, the weight generator 200 may write each value in the active weight register 400 into the CIM macro 155 as the weight value is generated. In other embodiments, the weight generator 200 may generate all the weight values before writing them all together into the CIM macro 155. At operation 445, the weight generator 200 computes the remaining weight values in the active weight register 400, as discussed above in FIG. 5. At operation 450, the weight generator 200 writes the weight values into the designated memory addresses of the CIM macro 155.

Specifically, the weight generator 200 sends the weight values to the multiplexer 220. The BIST FSM 170 generates the enable signal 190 and the control signal 310 to allow the multiplexer 220 to select the input 225 for writing the weight values into the CIM macro 155. Upon writing the input vector and the weight values into the CIM macro 155, at operation 455, the output data is received from the CIM macro. The operation 455 is similar to operation 360, and therefore, not described again. Similarly, operations 460-485 are similar to operations 365-390, and therefore, not described again. For example, at the operation 460, the comparator 275 compares the output data received at the operation 455 with the signature value for that cycle and the result (e.g., match, no match) of the comparison is stored in the register 280 at the operation 465. If, at the operation 470, the BIST FSM 170 determines that there are additional cycles of BIST to be performed, the process 425 loops back to the operation 440 if the same input vector is to be used to generate new weight values for the next cycle, or to the operation 435 if a different input vector and new weight values are to be used in the next cycle.

Upon completing all cycles, the BIST FSM 170 determines if all (or a threshold number of) cycles have results that match with their respective signature values at the operation 475 and determines whether the CIM macro 155 is normal at the operation 480 or faulty at the operation 485, as discussed above.

Figure 7:
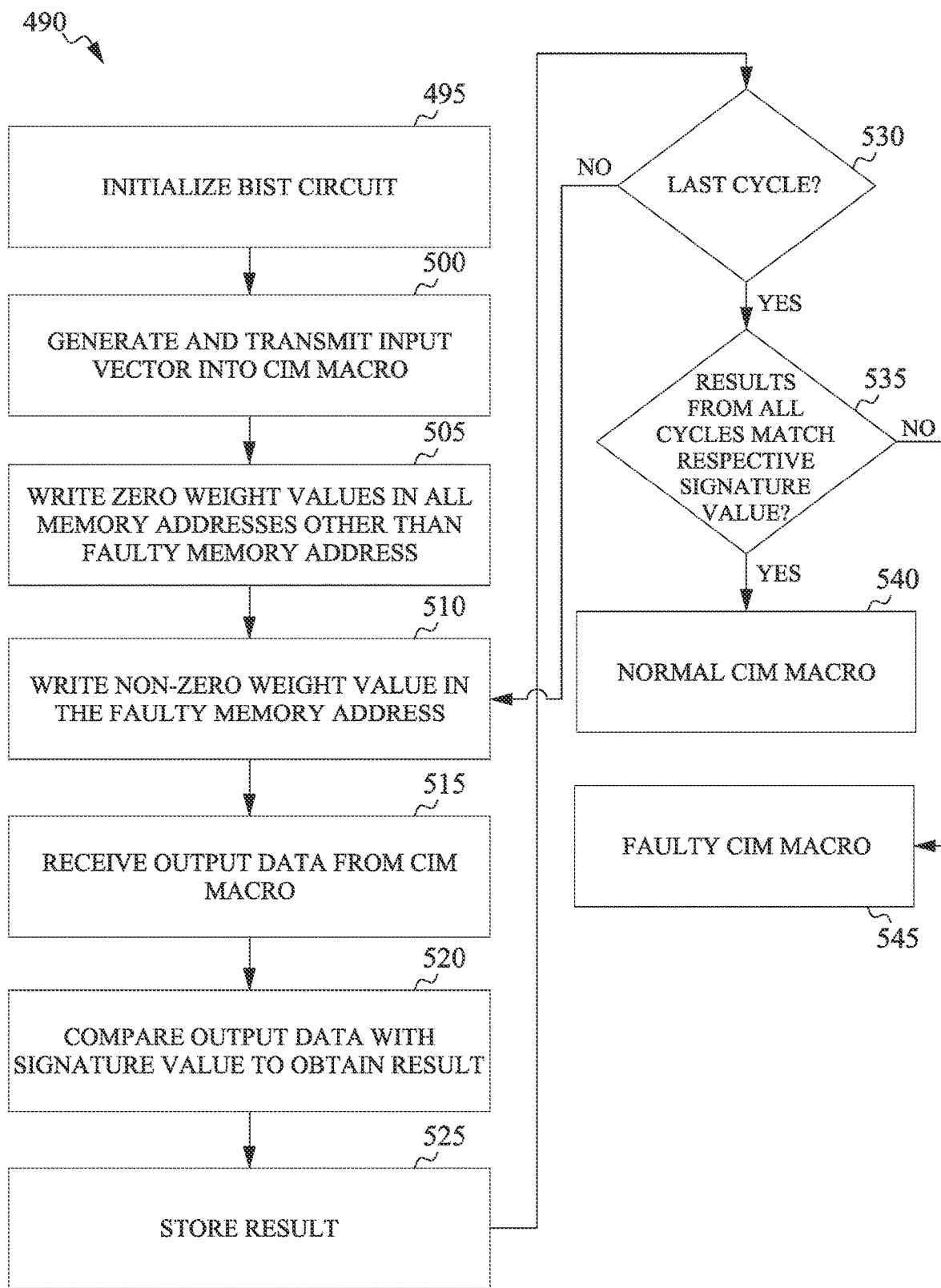
FIG. 7 is an example flowchart outlining operations of a process performed by the BIST circuit of FIG. 2 for implementing a multiple background weights BIST methodology on the CIM macro, in accordance with some embodiments of the present disclosure.

Referring now to FIG. 7, an example flowchart outlining operations of a process 490 is shown, in accordance with some embodiments of the present disclosure. The process 490 may be used to implement a multiple background weights BIST methodology by the BIST circuit 140. The multiple background weights BIST methodology may be particularly beneficial to use when faults in specific bits of a particular memory address are desired to be found. For example, in some embodiments, the processes of FIGS. 4 and 6 may be used to identify a faulty memory address. The process 490 may then be used to identify the exact bit of the faulty memory address that is faulty. Thus, the process 490 may afford better fault diagnosis. For example, in some embodiments, upon determining a faulty memory address, the BIST circuit 140 may write zero value weights to all memory addresses except for the faulty memory address. The weight value written into the faulty memory address may be changed in each cycle (e.g., by one bit) until the faulty bit (or bits) is (are) identified.

Thus, at operation 495, the BIST circuit 140 is initialized by writing configuration values in the configuration register 265. For example, in some embodiments, the configuration values may include the faulty memory address, weight values (or at least the initial weight register value) for the faulty memory address, number of cycles, signature value for each cycle, data pattern, and any other information that may be needed or considered desirable. The number of cycles when trying to identify one or more faulty bits may correspond to the number of bits in the faulty memory address. At operation 500, the data generator 160 generates an input vector and stores that input vector (e.g., into an input register) into the CIM macro 155, as discussed above. In some embodiments, the same input vector may be used in each cycle. In other embodiments, at least some of the cycles may use a different input vector. At operation 505, the weight generator 200 writes weight values of zeroes to all memory address locations other than the faulty memory address location.

Specifically, to generate the weight values, the address generator 215 generates the memory addresses of the CIM macro 155 where the zero weight values are to be written. The weight generator 200 may populate the rows of the active weight register 400 that correspond to the memory addresses where zero weight values are to be written with all zero values. At operation 510, the weight generator 200 writes a non-zero weight value in the faulty memory address. In some embodiments, the weight value may be supplied as a configuration value (e.g., as the initial weight register value) at the operation 495. Further, in some embodiments, instead of initializing the first row 405 of the active weight register 400 with the non-zero weight value supplied as an initial weight register value, that non-zero weight value may be added to the row of the active weight register that corresponds to the faulty memory address location. The weight generator 200 may receive the memory address of the faulty memory address location from the address generator 215 via the input 210. Although the operation 510 is described as being performed after the operation 505, in some embodiments, the operation 510 may be performed before the operation 505 or both operations may be performed in parallel.

At operation 515, the BIST circuit 140 receives the output data of the MAC operation from the CIM macro 155. The operation 515 is similar to the operation 360. Similarly, operations 520 and 525 are similar to the operations 365 and 370, respectively, in which the output data is compared with the signature value of the respective cycle, and the result (e.g., match or no match) of the comparison is stored within the register 280.

At operation 530, the BIST FSM 170 determines if all the bits of the faulty memory location have been tested. If not, the process 490 loops back to the operation 505 where a different weight value is written to the faulty memory address. For example, in some embodiments, one bit of the weight value from the previous cycle may be varied to generate the weight value for the next cycle. If at the operation 530, the BIST FSM 170 determines that all cycles are completed, the process 490 proceeds to operation 535.

Upon completing all cycles, the BIST FSM 170 determines if all (or a threshold number of) cycles have results that match with their respective signature values at the operation 535 and determines whether the faulty memory address passes or fails the BIST. If all the bits of the faulty memory address pass the BIST, then at operation 540, the CIM macro is considered normal. Otherwise, if at least one bit fails, the CIM macro is considered faulty at operation 545.

Figure 8:
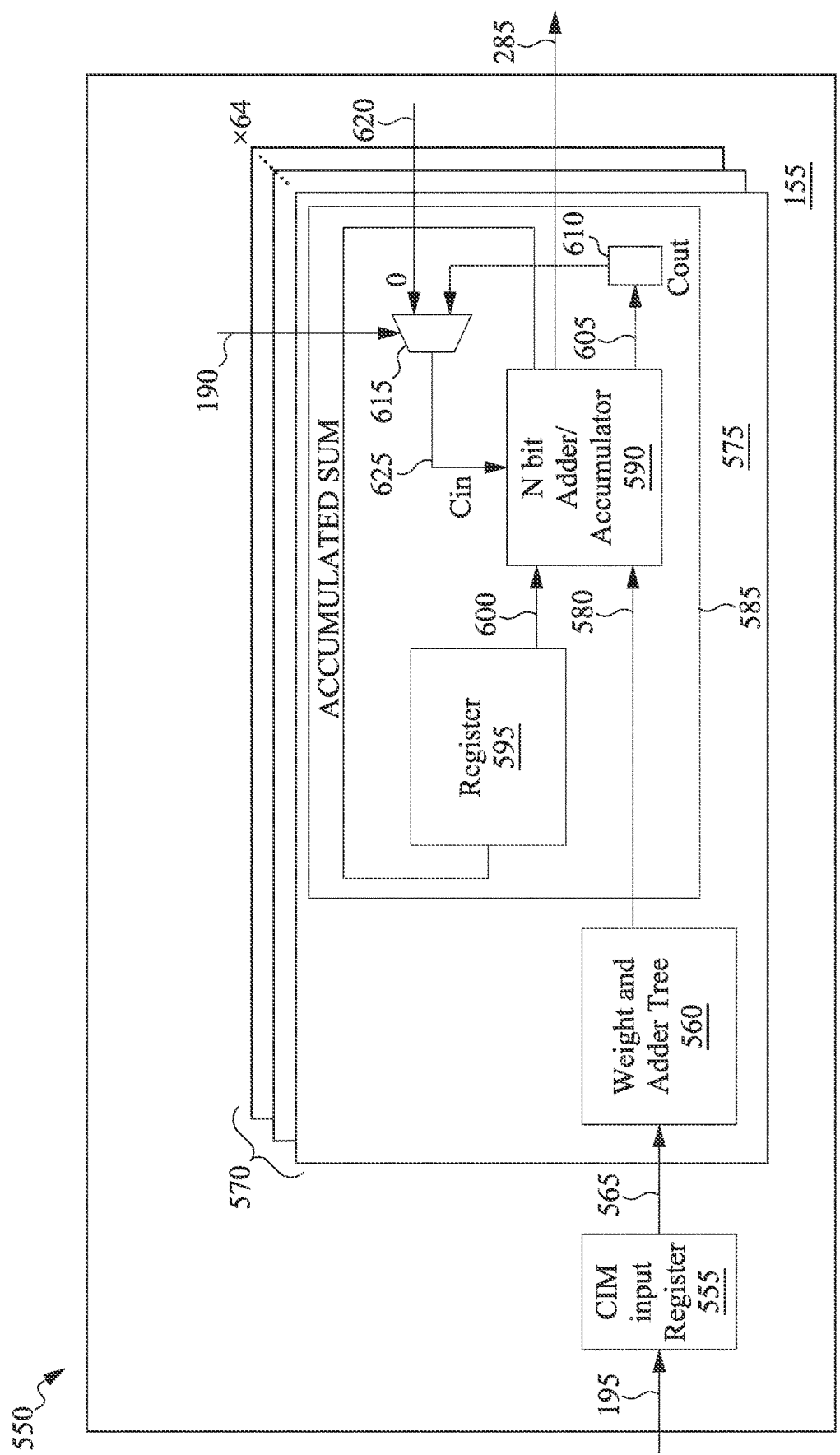
FIG. 8 is an example block diagram of a lossless compression BIST methodology, in accordance with some embodiments of the present disclosure.

Turning now to FIG. 8, an example block diagram 550 showing a lossless compression BIST methodology is shown, in accordance with some embodiments of the present disclosure. The block diagram 550 includes an input register 555 configured to store the input vectors (e.g., the output 195) generated by the data generator 160. In some embodiments, the input register 555 may be part of the BIST circuit 140. In other embodiments, the input register 555 may be part of the CIM macro 155, as shown in FIG. 8. Thus, in some embodiments, as input vectors are generated by the data generator 160, those input vectors may be stored in the input register 555 before being applied to the weights to perform the MAC operation. The input vector from the input register 555 for each cycle may be transmitted to a weight and adder tree 560, as shown by arrow 565.

The weight and adder tree 560 may be configured to perform the MAC operation on the input vector and the weights. In some embodiments and as discussed above, the CIM macro 155 may be configured such that the memory address space 330 may include a plurality of rows, with each row forming one memory address. In some embodiments, each row of the memory address space 330 may be configured with multiple segments, with each segment including a predefined number of bits. For example, in some embodiments, each row of the memory address space 330 may be configured in 4 bit segments. Thus, if for example, each row is configured with 256 bits and each segment is 4 bits, each row of the memory address space 330 may include 64 segments. Thus, each of the segments may be part of an "array" including the number of the plurality of rows in the memory address space 330 and one segment. For example, if the memory address space 330 includes 256 rows and each row of 256 bits is divided into segments of 4 bits each, each "array" may be a 256 rows×4 bit array and the CIM macro 155 may include a total of 64 arrays (e.g., 256 bits in a row divided by 4 bits in each segment=64). The 64 arrays are shown in FIG. 8 as arrays 570.

Although the example above includes 256 rows in the memory address space 330 and 256 bits in each row forming 4-bit segments, in other embodiments, the number of rows in the memory address space may vary. Similarly, the number of bits in each row and the number of bits in each segment may vary from one embodiment to another. Each of the arrays 570 may be configured to perform the MAC operation. Specifically, each of the arrays 570 may be configured to store a plurality of weights in each of the plurality of rows and apply the input vector to the stored plurality of weights. For example and continuing with the example above, a first array 575 of the arrays 570 may be a 256×4 bit array. Each of the 256 rows of the first array 575 may be configured to store a weight value and the input vector may be applied to each of the 256 rows. Thus, the weight and adder tree 560 may be configured to perform the MAC operation using the formula above on the weight values stored in the portion of the CIM macro 155 forming the first array 575 and the input vector being input from the input register 555.

More particularly, to perform the MAC operation, a product may be computed between the weight value of each row and the input vector. The products from each row may be summed to obtain a partial sum 580. In some embodiments, in a given cycle, the same input vector may be applied to each row of a particular array. For example and continuing with the example above, in some embodiments, each of the 256 rows in the first array 575 may be applied the same input vector in a given cycle. In other embodiments, at least some of the 256 rows in the first array 575 may be applied different input vectors in the same cycle. Further, in some embodiments, each of the arrays 570 may receive the same input vector(s) in a given cycle. For example, a second array of the arrays 570 may receive the same input vector(s) as the first array 575 in each cycle. In other embodiments, at least some of the arrays may receive different input vector(s) in a particular cycle.

Similarly, in some embodiments, the same weight values may be used in each of the arrays 570 in each cycle. In other embodiments, different weight values may be used in at least some of the arrays 570 in a given cycle. Further, in some embodiments, each of the 256 rows of each of the arrays 570 may store the same weight value in a given cycle. In other embodiments, at least some of the 256 rows of at least some of the arrays 570 may store different weight values in a given cycle. Thus, various combinations of the input vectors and the weight values are contemplated and considered within the scope of the present disclosure. Thus, the weight and adder tree 560 of each of the arrays 570 may perform the MAC operation and generate the partial sum 580. The partial sum 580 of each of the arrays 570 may be input into a partial sum circuit 585 of that particular array. Thus, although only shown in the first array 575, each of the arrays 570 may include the partial sum circuit 585.

The partial sum 580 may be input into an adder/accumulator 590 of the partial sum circuit 585. The adder/accumulator 590 may be configured to sum the partial sum 580 from each of the cycles of the respective array. Specifically, each cycle may generate the partial sum 580. The partial sum 580 from each cycle may be summed to generate the output 285. For example, if the number of cycles is 1000, the adder/accumulator 590 of the first array 575 may add the partial sum 580 from the second cycle to the partial sum from the first cycle to obtain a first accumulated sum, then sum the partial result from the third cycle to the first accumulated sum to obtain a second accumulated sum, sum the partial result from the fourth cycle to the second accumulated sum, and so on until the partial sums from all the 1000 cycles have been added to generate a single output (e.g., the output 285) after the $1000^{th}$ cycle. Although 1000 cycles are used, the number of cycles may vary from one embodiment to another.

After each cycle, the adder/accumulator 590 may send the first accumulated sum, the second accumulated sum, and so on to a register 595 for temporary storing. The register 595 may send that received value back as a latest accumulated sum 600 to the adder/accumulator 590 for being added to the partial sum 580 from the next cycle. In some embodiments, the sum of the latest accumulated sum 600 from the register 595 and the partial sum 580 from the weight and adder tree 560 may generate a carry over value. The carry over value may be output from the adder/accumulator 590 as a carryout value 605. In some embodiments, the carryout value 605 may be stored in a register 610 and provided to a multiplexer 615. Thus, in each cycle, as the adder/accumulator 590 sums the latest accumulated sum 600 and the partial sum 580, the adder/accumulator may generate the carryout value 605. In some embodiments, no carryout value may be generated. In such cases, the carryout value 605 may be zero.

The register 610 and the multiplexer 615 may form a carry rotation circuit to send the carryout value from a previous cycle back to the adder/accumulator 590 for summing in the next cycle. For example, the carryout value 605 generated in a first cycle may be recycled back to the adder/accumulator 590 for summing in a second cycle. Thus, in each cycle, the adder/accumulator 590 computes a sum between the latest accumulated sum 600, the partial sum 580, and the carryout value 605 from the previous cycle. Without accounting for the carryout value 605, the final output (e.g., the output 285) may be incorrect and lead to signature aliasing. Thus, by rotating the carryout value 605 back into the adder/accumulator 590, the adder/accumulator ensures that the sums are correctly computed by accounting for the carry out values, thereby avoiding signature aliasing and achieving a "lossless compression." "Lossless compression" as used herein means that the partial sum 580 of each of the cycles is combined together or compressed into a single final output (e.g., the final output 285) while accounting for the carryout value 605. Specifically, by virtue of rotating the carryout value 605, any data that may have been lost due to not accounting the carryout value is now accounted for, resulting in a lossless compression.

The multiplexer 615 may also receive an input 620. In some embodiments, the input 620 may be set to zero and may be used during a functional operation (e.g., normal operation) of the CIM macro 155. The operation of the multiplexer 615 may be controlled by the enable signal 190 generated by the BIST circuit 140. If the enable signal 190 indicates a BIST mode, the multiplexer 615 selects the carryout value 605 as a carry-in (CIN) value 625. If the enable signal 190 indicates a functional mode, the multiplexer 615 selects the input 620 as the carry-in value 625, which is fed back into the adder/accumulator 590.

Upon the completion of all cycles, the final output from the adder/accumulator 590 is transmitted as the output 285 for comparison with the signature value(s). Although not shown, each of the input register 555, the weight & adder tree 560, the adder/accumulator 590, the register 595, the register 610, and the multiplexer 615 may be configured as hardware, software, firmware, or a combination thereof.

Figure 9:
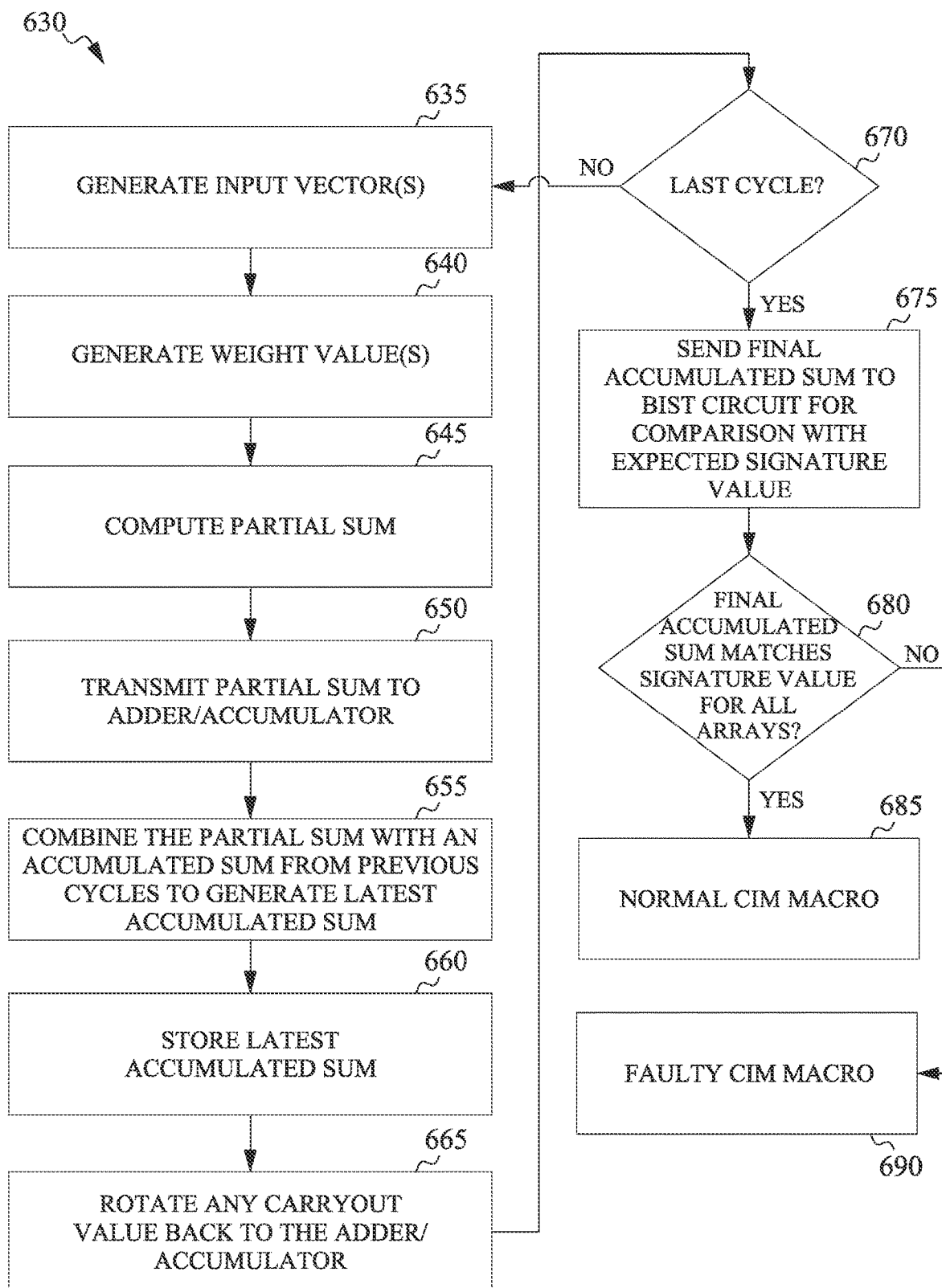
FIG. 9 is an example flowchart outlining operations of a process performed by the BIST circuit of FIG. 2 and the CIM macro for implementing the lossless compression BIST methodology of FIG. 8, in accordance with some embodiments of the present disclosure.

Referring now to FIG. 9, an example flowchart outlining operation of a process 630 is shown, in accordance with some embodiments of the present disclosure. The process 630 may be used to implement a lossless compression BIST methodology by the CIM macro 155 and the BIST circuit 140. The process 630 begins at the operation 635 with each of the arrays 570 receiving the input vector(s) generated by the data generator 160. Specifically, before the performance of the process 630, the BIST circuit 140 may be initialized by writing configuration values in the configuration register 265. For example, in some embodiments, the configuration values may include the weight value(s) (or at least the initial weight register value) for each cycle for each of the arrays 570, the number of cycles, signature value for each of the arrays, data pattern(s) for each cycle for each of the arrays, and any other information that may be needed or considered desirable. At the operation 635, each of the arrays 570, and particularly, the weight and adder tree 560 of each of those arrays receives the input vector(s) from the input register 555. The input vector(s) are generated by the data generator 160 of the BIST circuit 140 and stored into the input register 555. At operation 640, each of the arrays 570, and particularly the weight and adder tree 560 of each of those arrays receives the weight value(s) generated by the weight generator 200 as discussed above.

At operation 645, the weight and adder tree 560 of each of the arrays 570 computes the partial sum 580 by performing a MAC operation based on the input vector of the operation 635 and the weight values of the operation 640. The weight and adder tree 560 of each of the arrays 570 transmits the partial sum 580 to the adder/accumulator 590 of the respective arrays at operation 650. At operation 655, the adder/accumulator 590 of each of the arrays 570 receives and computes a sum between the latest accumulated sum from the register 595 corresponding to the sums of all the partial sums from all previous cycles, the carry-in value 625 corresponding to the carryout value 605 from the immediately previous cycle, and the partial sum 580 from the weight and adder tree 560 of the current cycle to generate a latest accumulated sum. The latest accumulated sum is stored within the register 595 at operation 660 and transmitted back to the adder/accumulator for computation in the next cycle. Also, at operation 665, the carryout value 605 from the current cycle is fed back to the adder/accumulator 590 via the multiplexer 615. The operations 660 and 665 may occur in parallel or the operation 665 may occur before the operation 660.

At operation 670, the CIM macro 155 or the BIST FSM 170 determines if additional cycles are remaining. In some embodiments, the CIM macro 155 may determine that the current cycle is the last cycle if no new input vector(s) and/or weight value(s) are received by the weight and adder tree 560. In other embodiments, the CIM macro 155 may identify the last cycle in other ways. If at the operation 670, it is determined that additional cycles are pending, the process 630 loops back to the operation 635 for receiving new input vector(s). In some embodiments, only the weight values may change from one cycle to the next. In such cases, the process 630 may loop back to the operation 640 instead. Further, in some embodiments in which new input vector(s) are provided, same weight value(s) may be used. In such cases, the operation 640 may be skipped.

If at the operation 670, it is determined that the current cycle is the last cycle, the process 630 proceeds to operation 675 where the final latest accumulated sum from the adder/accumulator 590 is sent out as the output 285 to the BIST circuit 140. In some embodiments, the adder/accumulator 590 may also send out the latest accumulated sum from each cycle to the BIST circuit 140. The BIST circuit 140 may either ignore such intermediate latest accumulated sum values or store the intermediate latest accumulated sum values. The final latest accumulated sum may be used by the BIST circuit 140 to determine whether the CIM macro 155 is normal or faulty. Thus, operations 680-690 may be performed by the BIST circuit 140. Thus, at the operation 675, the BIST circuit 140 may receive the final latest accumulated sum from each of the arrays 570. At the operation 680, the BIST circuit 140 compares the received final latest accumulated sum from each of the arrays 570 with the expected signature value(s). If all (or a predetermined number of) the final latest accumulated sums from the arrays 570 match their respective signature value(s), the CIM macro 155 is declared to be normal at the operation 685. If at least one (or a predetermined number of) of the final latest accumulated sum does not match the respective signature value, the CIM macro 155 is declared to be faulty at operation 690.

Thus, the present disclosure provides an easy, effective, and accurate method for performing BIST on a CIM macro. The BIST methodologies of the present disclosure may be used without needing to modify an existing CIM macro. The BIST methodologies disclosed herein provide a high-test coverage solution by using deterministic signed weights, random or deterministic input vectors, signed or unsigned values, and using the MAC operations to test the CIM macro without needing any specialized simulations. The BIST methodologies may be used to test the CIM macro over a wide range of input vectors and weight values. The BIST methodologies of the present disclosure are highly configurable, provide easier fault diagnostics, and provide deterministic results that lead to better resolution between normal and faulty CIM macros. The BIST methodologies of the present disclosure also provide high test coverage at high speed and short test time. For example, tests that the inventors conducted using 8 deterministic weights and 1000 pseudorandom input vectors resulted in about 99% test coverage of the CIM macro in about 15 microseconds at 1 Giga Hertz.

In accordance with some aspects of the present disclosure, a method is disclosed. The method includes generating, by a built-in self-test circuit, a plurality of input vectors for transmission to a memory macro for testing the memory macro. At least one input vector of the plurality of input vectors is transmitted to the memory macro in each of a plurality of cycles. The method also includes receiving, by the built-in self-test circuit, in each of the plurality of cycles, an output data from the memory macro, such that the output data is generated by the memory macro in response to processing the at least one input vector, comparing, by the built-in self-test circuit, the output data in each of the plurality of cycles with a signature value, and determining, by the built-in self-test circuit, whether the memory macro is normal or faulty based upon the comparison.

In accordance with some other aspects of the present disclosure, another method is disclosed. The method includes generating, by a built-in self-test circuit, a plurality of weight values in a plurality of cycles for writing to a memory macro for testing the memory macro, such that generating the plurality of weight values in each of the plurality of cycles includes receiving, by the built-in self-test circuit, an initial weight register value, receiving, by the built-in self-test circuit, an increment value, initializing, by the built-in self-test circuit, an active weight register value with the initial weight register value to obtain a first weight value of the plurality of weight values, and incrementing, by the built-in self-test circuit, the active weight register value as a function of a previous active weight register value and the increment value to obtain additional weight values of the plurality of weight values. The method also includes receiving, by the built-in self-test circuit, in each of the plurality of cycles, an output data from the memory macro, such that the output data of each of the plurality of cycles is generated by the memory macro in response to processing an input vector and the plurality of weight values, comparing, by the built-in self-test circuit, the output data in each of the plurality of cycles with a signature value associated with a respective one of the plurality of cycles, and determining, by the built-in self-test circuit, whether the memory macro is normal or faulty based upon the comparison.

In accordance with yet other aspects of the present disclosure, a built-in self-test circuit is disclosed. The built-in self-test circuit includes a memory having computer-readable instructions stored thereon and a processor that executes the computer-readable instructions to generate and transmit a plurality of input vectors in a plurality of cycles to a plurality of arrays of a memory macro for testing the memory macro, such that at least one input vector of the plurality of input vectors is transmitted to each of the plurality of arrays in each of the plurality of cycles, generate and transmit a plurality of weights for writing to each of the plurality of arrays of the memory macro in each of the plurality of cycles, and receive a final sum value from each of the plurality of arrays of the memory macro, such that the final sum from each of the plurality of arrays corresponds to a computation performed in each of the plurality of arrays over the plurality of cycles. The processor further executes the computer-readable instructions to compare the final sum value from each of the plurality of arrays with an expected signature value, and determine that the memory macro is normal based upon the final sum value from each of the plurality of arrays matching the expected signature value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
generating, by a built-in self-test circuit, a plurality of input vectors for transmission to a memory macro for testing the memory macro, wherein at least one input vector of the plurality of input vectors is transmitted to the memory macro in each of a plurality of cycles;
receiving, by the built-in self-test circuit, in each of the plurality of cycles, an output data from the memory macro, wherein the output data is generated by the memory macro in response to processing the at least one input vector;
comparing, by the built-in self-test circuit, the output data in each of the plurality of cycles with a signature value; and
determining, by the built-in self-test circuit, that the memory macro is normal based on the output data matching the signature value in each of the plurality of cycles or faulty based on the output data not matching the signature value in at least one of the plurality of cycles.

2. The method of claim 1, wherein the at least one input vector is random, pseudorandom, or deterministic.

3. The method of claim 1, wherein the at least one input vector is signed or unsigned.

4. The method of claim 1, wherein the memory macro is a compute in memory macro.

5. The method of claim 1, further comprising writing, by the built-in self-test circuit, a plurality of weight values in the memory macro in each of the plurality of cycles, wherein the processing of the at least one input vector in each of the plurality of cycles comprises performing a multiply-and-accumulate operation between the plurality of weight values and the at least one input vector.

6. The method of claim 5, wherein each of the plurality of weight values comprises a signed value or an unsigned value.

7. The method of claim 5, further comprising:
generating, by the built-in self-test circuit, a weight value of the plurality of weight values by:
receiving, by the built-in self-test circuit, an initial weight register value; and
initializing, by the built-in self-test circuit, an active weight register value with the initial weight register value to obtain the weight value.

8. The method of claim 1, wherein a number of the plurality of cycles is greater than a number of cycles used during a functional operation of the memory macro.

9. The method of claim 1, wherein the plurality of input vectors comprises a different input vector in each of the plurality of cycles, and wherein each of the different input vector is associated with a different signature value for comparison with the output data.

10. The method of claim 1, wherein a same input vector is used in each of the plurality of cycles.

11. The method of claim 1, wherein the input vector that is used in at least some of the plurality of cycles is different from the input vector that is used in other ones of the plurality of cycles.

12. A built-in self-test circuit comprising:
a memory having computer-readable instructions stored thereon; and
a processor that executes the computer-readable instructions to:
generate and write a plurality of weight values in a plurality of cycles to a memory macro for testing the memory macro;
generate and transmit a plurality of input vectors to the memory macro, wherein at least one input vector of the plurality of input vectors is transmitted to the memory macro in each of a plurality of cycles, and wherein a number of the plurality of cycles is greater than a number of cycles used during a functional operation of the memory macro;
receive in each of the plurality of cycles, an output data from the memory macro, wherein the output data of each of the plurality of cycles is generated by the memory macro in response to processing the at least one input vector and at least one weight value of the plurality of weight values; and
determine whether the memory macro is normal or faulty based upon a comparison of the output data in each of the plurality of cycles with a signature value associated with a respective one of the plurality of cycles.

13. The built-in self-test circuit of claim 12, wherein to generate the plurality of weight values in each of the plurality of cycles, the processor further executes computer-readable instructions to:
receive an initial weight register value;
receive an increment value;
initialize an active weight register value with the initial weight register value to obtain a first weight value of the plurality of weight values; and
increment the active weight register value as a function of a previous active weight register value and the increment value to obtain additional weight values of the plurality of weight values.

14. The built-in self-test circuit of claim 12, wherein the at least one input vector is random, pseudorandom, or deterministic.

15. The built-in self-test circuit of claim 12, wherein the at least one input vector is signed or unsigned.

16. The built-in self-test circuit of claim 12, wherein the processor further executes computer-readable instructions to:
determine that the memory macro is normal based on the output data matching the signature value in each of the plurality of cycles; or
determine that the memory macro is faulty based on the output data not matching the signature value in at least one of the plurality of cycles.

17. The built-in self-test circuit of claim 12, wherein each of the plurality of weight values comprises a signed value or an unsigned value.

18. A method comprising:
generating and transmitting, by a built-in self-test circuit, a plurality of input vectors in a plurality of cycles to a plurality of arrays of a memory macro for testing the memory macro;
generating and transmitting, by the built-in self-test circuit, a plurality of weight values for writing to each of the plurality of arrays of the memory macro in each of the plurality of cycles;
receiving, by the built-in self-test circuit, a final sum value from each of the plurality of arrays of the memory macro over the plurality of cycles; and
determining, by the built-in self-test circuit, whether the memory macro is normal or faulty based on a comparison of the final sum value from each of the plurality of arrays with an expected signature value.

19. The method of claim 18, wherein generating, by the built-in self-test circuit, a weight value of the plurality of weight values comprises:
receiving, by the built-in self-test circuit, an initial weight register value; and
initializing, by the built-in self-test circuit, an active weight register value with the initial weight register value to obtain the weight value.

20. The method of claim 18, wherein a number of the plurality of cycles is greater than a number of cycles used during a functional operation of the memory macro.

* * * * *